(12) United States Patent
Lipson et al.

(10) Patent No.: US 7,423,732 B2
(45) Date of Patent: Sep. 9, 2008

(54) LITHOGRAPHIC APPARATUS AND DEVICE MANUFACTURING METHOD UTILIZING PLACEMENT OF A PATTERNING DEVICE AT A PUPIL PLANE

(75) Inventors: Matthew Lipson, Stamford, CT (US); Azat M. Latypov, Danbury, CT (US)

(73) Assignee: ASML Holding N.V., Veldhoven (NL)

( * ) Notice: Subject to any disclaimer, the term of this patent is extended or adjusted under 35 U.S.C. 154(b) by 13 days.

(21) Appl. No.: 11/194,576

(22) Filed: Aug. 2, 2005

(65) Prior Publication Data

US 2006/0092396 A1  May 4, 2006

Related U.S. Application Data

(60) Provisional application No. 60/624,749, filed on Nov. 4, 2004.

(51) Int. Cl.
 *G03B 27/58* (2006.01)
 *G03B 27/42* (2006.01)

(52) U.S. Cl. .......................................... 355/72; 355/53

(58) Field of Classification Search .................. 355/53, 355/55, 67–71, 72–76; 250/548; 356/399–401; 430/311; 310/10, 12; 378/34, 35; 361/234
See application file for complete search history.

(56) References Cited

U.S. PATENT DOCUMENTS

| | | | |
|---|---|---|---|
| 5,040,879 A * | 8/1991 | Haven | 349/21 |
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A * | 10/2000 | Johnson | 355/67 |
| 6,177,980 B1 | 1/2001 | Johnson | |
| 6,433,917 B1 * | 8/2002 | Mei et al. | 359/292 |
| 6,555,274 B1 * | 4/2003 | Kye et al. | 430/5 |
| 6,687,041 B1 | 2/2004 | Sandstrom | |
| 6,747,783 B1 | 6/2004 | Sandstrom | |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,870,554 B2 | 3/2005 | Jain | |
| 6,870,601 B2 | 3/2005 | Liebregts et al. | |

(Continued)

FOREIGN PATENT DOCUMENTS

WO    WO 98/33096    7/1998

(Continued)

*Primary Examiner*—Hung Henry Nguyen
(74) *Attorney, Agent, or Firm*—Sterne, Kessler, Goldstein & Fox P.L.L.C.

(57) ABSTRACT

A lithography system comprises an illumination system that supplies radiation and a projection system comprising an optical system and a patterning device located at a pupil plane. The patterning device patterns the radiation and the optical system projects the patterned radiation onto a target portion of a substrate. In one example, an additional patterning device is located at an object plane of the lithography system and patterns the radiation before the patterning device at the pupil plane.

9 Claims, 5 Drawing Sheets

U.S. PATENT DOCUMENTS

| | | | |
|---|---|---|---|
| 6,977,728 B2 * | 12/2005 | Nakauchi | 356/399 |
| 7,180,573 B2 * | 2/2007 | Lipson et al. | 355/53 |
| 2002/0191170 A1 * | 12/2002 | Komatsuda | 355/67 |
| 2004/0001190 A1 * | 1/2004 | Tsuji | 355/53 |
| 2004/0048167 A1 * | 3/2004 | Smith | 430/5 |
| 2005/0007572 A1 | 1/2005 | George et al. | |
| 2005/0146701 A1 * | 7/2005 | Holderer et al. | 355/67 |

FOREIGN PATENT DOCUMENTS

| | | |
|---|---|---|
| WO | WO 98/38597 | 9/1998 |

\* cited by examiner

LITHOGRAPHIC APPARATUS AND DEVICE MANUFACTURING METHOD UTILIZING PLACEMENT OF A PATTERNING DEVICE AT A PUPIL PLANE

CROSS REFERENCE TO RELATED APPLICATIONS

This application claims benefit under 35 U.S.C. § 119(e) to U.S. Provisional Patent Application 60/624,749, entitled "Placement of Spatial Light Modulators at Pupil Plane for Maskless Lithography," to Latypov et al., filed on Nov. 4, 2004, the entirety of which is hereby incorporated by reference as if fully set forth herein.

BACKGROUND

1. Field

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred on (part of) the substrate (e.g., a glass plate), e.g., via imaging onto a layer of radiation-sensitive material (resist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate can be rectangular in shape. Lithographic apparatus designed to expose a substrate of this type can provide an exposure region that covers a full width of the rectangular substrate, or which covers a portion of the width (for example half of the width). The substrate can be scanned underneath the exposure region, while the mask or reticle is synchronously scanned through the projection beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Many of the existing maskless lithography rasterization algorithms are based on determining the states of the array of individually programmable elements pixels when the array is located in the object plane that will render the desired pattern at a field plane or image plane. These rasterization algorithms may not be the most efficient, may have sensitivity to dead or broken pixels, and may not result in optimal optical performance of the lithography system.

Therefore, what is needed is a system and method that improves the optical performance of a maskless lithographic systems.

SUMMARY

In one embodiment of the present invention there is provided a lithography system comprising an illumination system that supplies radiation and a projection system comprising an optical system and a patterning device located at a pupil plane. The patterning device patterns the radiation and the optical system projects the patterned radiation onto a target portion of a substrate.

In another embodiment of the present invention, a device manufacturing method, comprises the following steps: modulating radiation using a patterning device positioned at a pupil plane of a lithography system; and projecting the patterned radiation onto a target portion of a substrate.

In a further embodiment of the present invention, a lithography system comprises an illumination system that supplies radiation, a first patterning device located at an object plane that patterns the radiation, a second patterning device located at a pupil plane that further patterns the radiation, and a projection system that projects the patterned radiation onto a target portion of a substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the present invention and to enable a person skilled in the pertinent art to make and use the present invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

Table of Contents

I. Introduction And Overview

II. Example Pupil Plane Array Of Individually Programmable Elements In Accordance With One Embodiment Of The Present Invention III. Example Method Of Using A Lithography System Having A Pupil Plane Array Of Individually Programmable Elements IV. Example Advantages V. Conclusion

I. Introduction and Overview

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Figure 1:
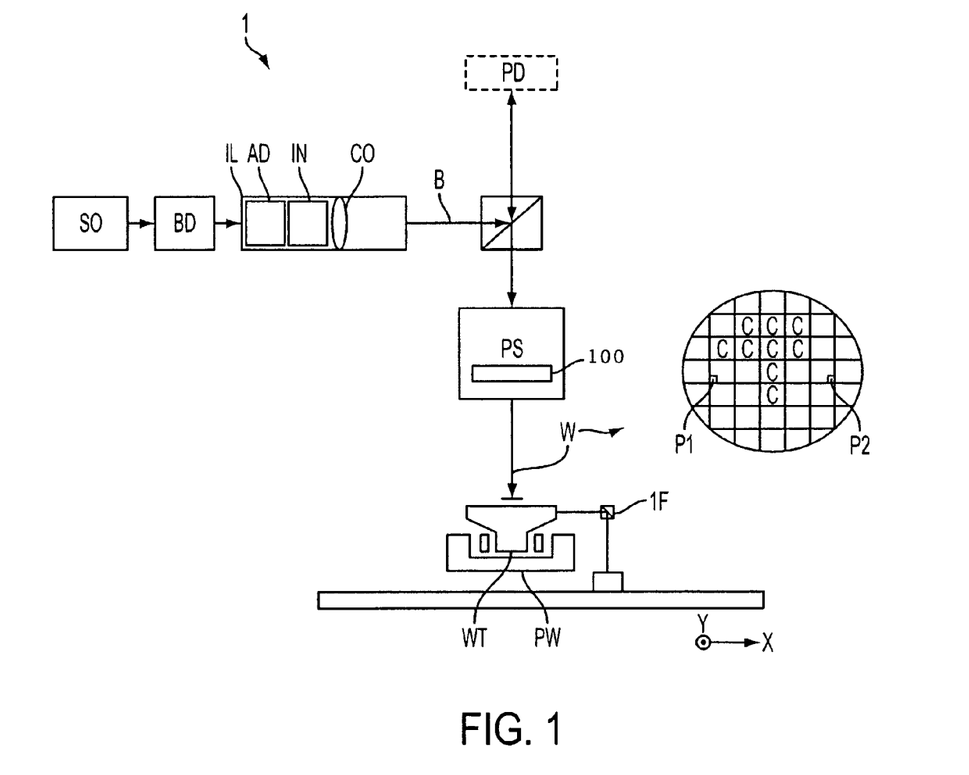
FIGS. 1 and 2 depict lithographic apparatus, according to various embodiments of the present invention.

FIG. 1 schematically depicts a lithographic apparatus according to one embodiment of the present invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the projection beam. In general, the position of the array of individually controllable elements will be fixed relative to the projection system PS. However, it can instead be connected to a positioner configured to accurately position the array of individually controllable elements in accordance with certain parameters. In one example, either in addition to or in replacement of patterning device PD, a patterning device 100 (e.g. an array of individually programmable elements) is positioned in a pupil or pupil plane of projection system PS. The use of either one or both of these devices in conjunction with each other is described in more detail below.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can include dynamic (e.g., arrays of programmable elements) patterning devices, and/or dynamic patterning devices coupled with static patterning devices (e.g., masks or reticles). For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In one embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In one embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. In one example, the thickness of the substrate is at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

Figure 2:
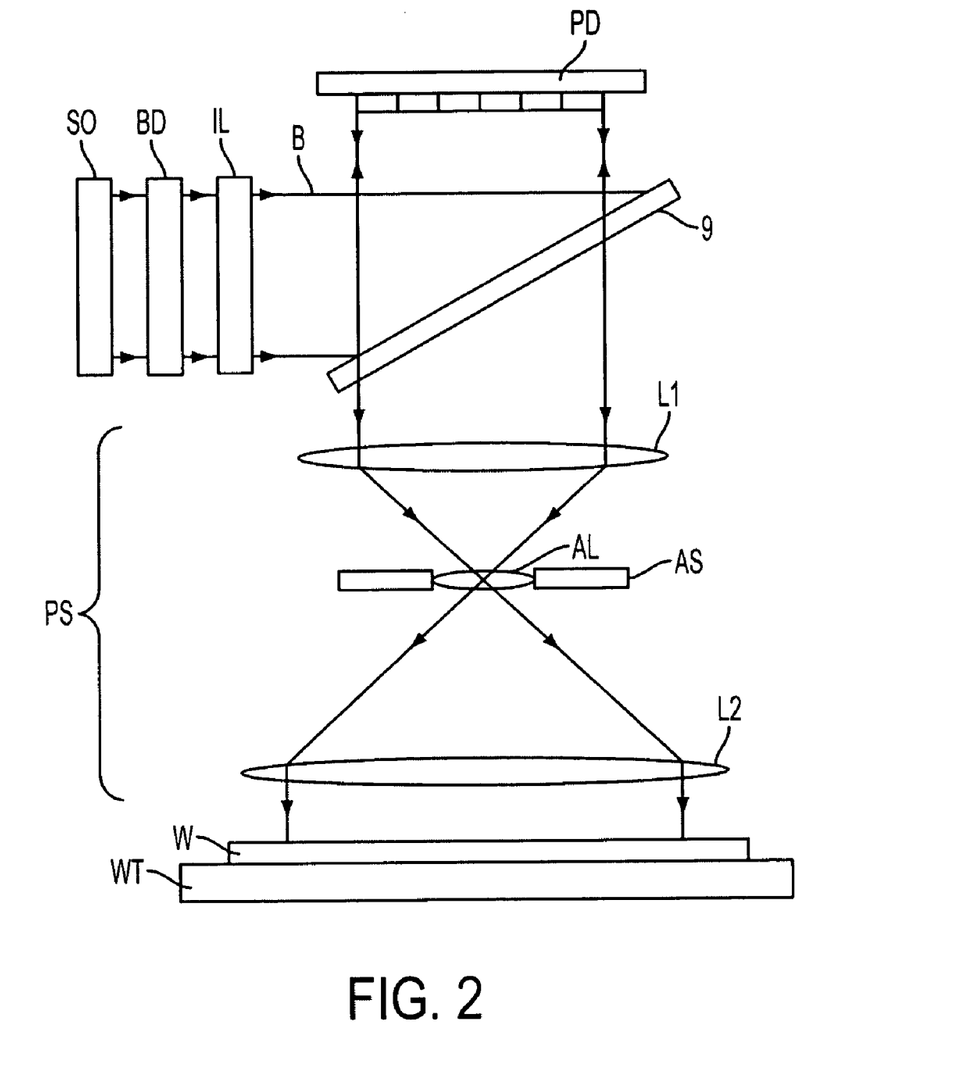

As herein depicted in FIGS. 1 and 2, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system.

Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

In one example, the radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W.

In one example, the radiation beam B is incident directly on the patterning device 100 (e.g., an array of individually controllable elements) and is modulated by the patterning device 100. Having been transmitted through the patterning device 100, the radiation beam B passes through the remainder of projection system PS, which focuses the beam onto a target portion C of the substrate W.

With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the projection beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used. Also, in the example where a pattern device 100 is used, beam splitter BS could be replaced with a folding mirror (not shown) or radiation B may come from an illumination system IL positioned where patterning device PD is shown in FIG. 1.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam B is caused to scan a line across the substrate W. The pattern on the array of individually controllable elements is updated as required between pulses of the radiation system and the pulses are timed such that successive target portions C are exposed at the required locations on the substrate W. Consequently, the projection beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the projection beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary not only to maximum or minimum intensity levels but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In one embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In one embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

Referring to FIG. 1, in accordance with one embodiment of the present invention, pupil plane array of individually programmable elements 100 are oriented at the pupil plane of projection system PS. As is known by persons skilled in the relevant art(s), the location of the pupil plane is determined by features of optical instrumentation included within a projection system. Accordingly, the location of pupil plane array of individually programmable elements 100 is determined by the location of the pupil plane of projection system PS. For example, in one embodiment, pupil plane array of individually programmable elements 100 is located within a housing of projection system PS (shown in FIG. 1). In another embodiment, pupil plane array of individually programmable elements 100 is not located within the housing of projection system PS (not shown).

In one example, a positioning device (not shown) for pupil plane array of individually programmable elements 100 can be used to accurately correct the position of pupil plane array of individually programmable elements 100 with respect to the path of beam B, e.g., during a scan. In one embodiment in which reflective device PD also comprises an array of individually programmable elements ("object plane array of individually programmable elements"), a second positioning device (not shown) can be used to accurately correct the position of object plane array of individually programmable elements PD with respect to the path of beam B.

In another example, movement of substrate table WT is realized with the aid of a long-stroke module (course positioning) and a short-stroke module (fine positioning), which are not explicitly depicted in FIG. 1. A similar system can also be used to position pupil plane array of individually programmable elements 100 and/or patterning device PD. It will be appreciated that beam B may alternatively/additionally be moveable, while substrate table WT and/or pupil plane array of individually programmable elements 100 and/or object plane array of individually programmable elements PD (when applicable) may have a fixed position to provide the required relative movement.

II. Example Pupil Plane Array of Individually Programmable Elements in Accordance with One Embodiment of the Present Invention As mentioned above, an example lithography system in accordance with one embodiment of the present invention includes pupil plane array of individually programmable elements 100. Pupil plane array of individually programmable elements 100 can be reflective or transmissive, although shown as transmissive in FIG. 1. Example reflective array of individually programmable elements can include, but are not limited to, tilting mirrors, phase step mirrors, pistoning mirrors, or the like, as discussed in more detail above.

Figure 3A:
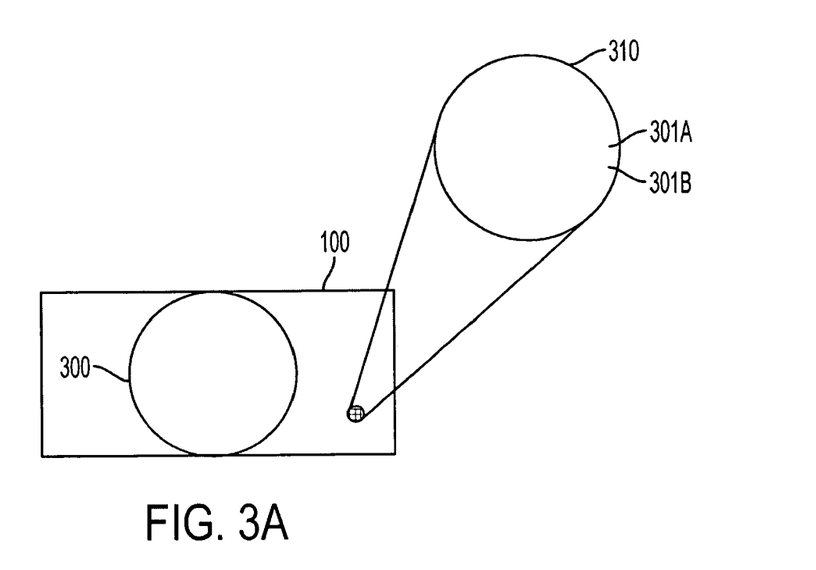
FIGS. 3A and 3B illustrate arrangements of arrays of individually controllable elements located at a pupil plane in accordance with embodiments of the present invention.

Pupil plane arrays of individually programmable elements can be arranged in several different ways. For example, FIG. 3A illustrates array of individually programmable elements 100 completely filling a pupil 300, where pupil 300 can be, e.g., a pupil of projection system PS of apparatus 1. As seen from a magnified perspective 310, array 100 includes a plurality of individually programmable elements, e.g., an element 301A and an element 301B. Each of these individually programmable elements can modulate incident radiation (e.g., radiation beam B (FIG. 1)). As mentioned above and discussed below, array of individually programmable elements 100 can include pistoning mirrors, tilting mirrors, phase-step tilting mirrors, and/or pistoning mirrors with LCD cells respectively disposed thereon.

Figure 3B:
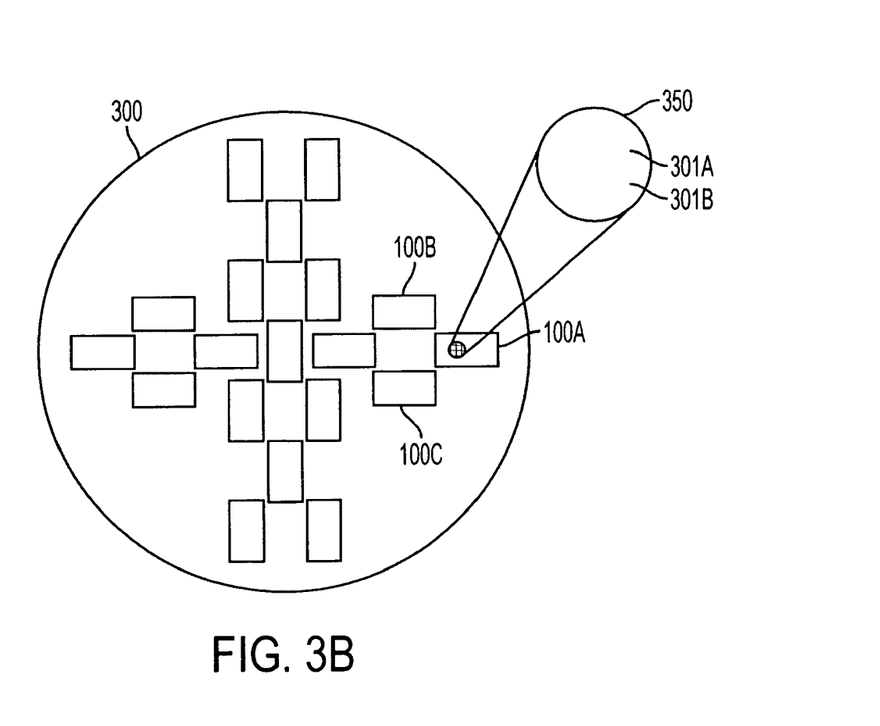

FIG. 3B illustrates several arrays of individually programmable elements arranged within pupil 300. Each array includes a plurality of programmable elements that can modulate incident radiation. For instances, as shown in FIG. 3B, array of individually programmable elements 100A includes, for example, programmable element 301A and programmable element 301B.

According to one embodiment of the present invention, pupil plane array of individually programmable elements 100 have pixels that can vary two optical parameters (e.g., an amplitude and a phase) of radiation beam B. Array of individually programmable elements that vary two optical parameters can more accurately recreate a distribution of the field in the pupil. As described below, there are several example arrangements that can be used to modulate both an amplitude and phase. However, it is to be appreciated that the example arrangements presented below are for illustrative purposes only, and not limitation. Other arrangements for modulating an amplitude and phase of beam B are contemplated within the scope of the present invention, as would be apparent to a person skilled in the relevant art(s).

Figure 4:
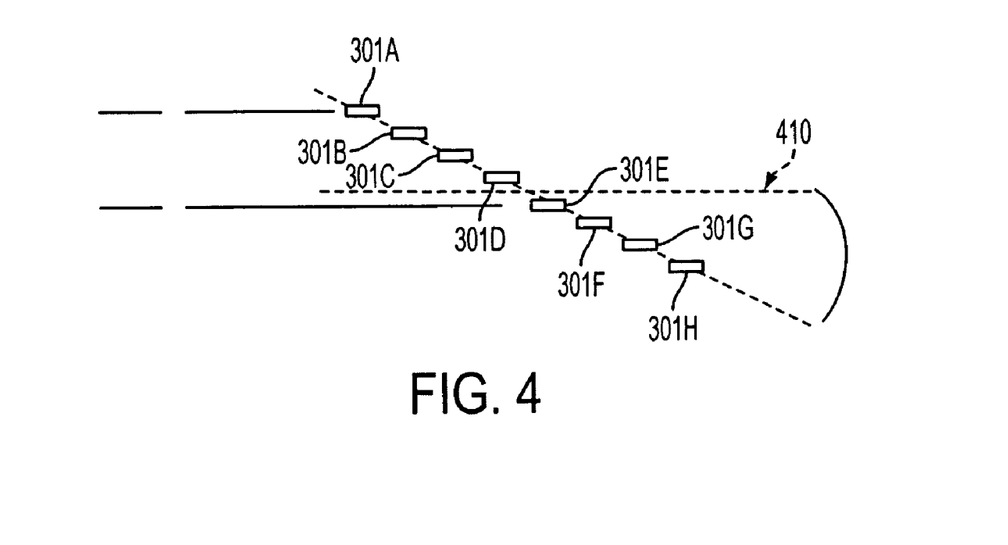
FIG. 4 illustrates a side view of pistoning mirrors used in an embodiment of the present invention.

An example arrangement that can be used to modulate both a phase and amplitude includes an array of pistoning mirrors-provided each pistoning mirror is small relative to the size of the pupil, as discussed below. Individual pistoning mirrors can be used to modulate the phase of radiation B (FIG. 1) and a coupling of two or more pistoning mirrors can be used to modulate the amplitude of radiation B. For example, FIG. 4 illustrates a side view of an example arrangement of pistoning mirrors 301A-301H. The phase of incident radiation B can be modulated by pistoning an individual mirror 301 above or below axis 410. The amplitude of incident radiation B can be modulated by interfering diffracted radiation from one or more pistoning mirror(s) (e.g., pistoning mirrors 301A-301D) with diffracted radiation from one or more other pistoning mirror(s) (e.g., pistoning mirrors 301E-301H). That is, the coupling of the pistoning mirrors serves to modulate the incident radiation in much the same way as a tilting mirror.

As mentioned above, each pistoning mirror in the array should be small relative to the full size of the pupil. For example, each individually programmable element 301 may be approximately 15 μm×15 μm and the dimensions of array 100 may be approximately 8 mm×33 mm. In other words, array 100 includes approximately 512 elements along a first dimension and approximately 2048 elements along a second dimension. As shown in FIGS. 3A and 3B, pupil 300 is at least as large as the smallest dimension of array 100 (e.g., the smallest diameter of pupil 300 is 8 mm). According to these example dimensions, each individual programmable element 301 is at least 200,000 times smaller than pupil 300.

Another example arrangement that can be used to modulate both an amplitude and phase includes an array of tilting mirrors at an object plane and an array of pistoning mirrors at a corresponding pupil plane. The tilting mirrors at the object plane (e.g., illustrated in FIG. 1 as patterning device PD) can be used to modulate the amplitude of the radiation and the pistoning mirrors at the pupil plane (e.g., illustrated in FIG. 1 as array of individually programmable elements 100) can be used to modulate the phase of the radiation.

Figure 5:
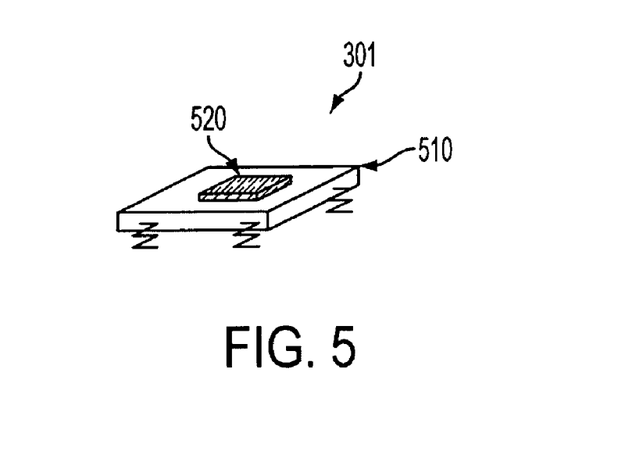
FIG. 5 illustrates an individually controllable element that can modulate an amplitude and phase of incident radiation in accordance with an embodiment of the present invention.

A further example arrangement that can be used to modulate both an amplitude and phase includes an array of pistoning mirrors, with each pistoning mirror having a liquid crystal display (LCD) cell disposed thereon. For example, FIG. 5 illustrates an individual programmable element 301 that includes a pistoning mirror 510 and an LCD cell 520 disposed thereon. Each pistoning mirror 510 in an array of individually programmable elements can be used to modulate the amplitude of radiation B and each LCD cell 520 can be used to modulate the phase of radiation B.

In an alternative embodiment, pupil plane array of individually programmable elements 100 have pixels that vary only one optical parameter. These one parametric pixels are used to modulate the field in the pupil. For example, pupil plane array of individually programmable elements 100 can be tilting mirrors. Modulation of such an array of individually programmable elements utilizes a field stop to block at least a portion of the diffracted light. Since a field stop typically cannot be placed on top of a resist-coated wafer, an intermediate image plane can be created and the field stop can be located therein.

As noted above, patterning device PD can include an array of individually programmable elements, which will be referred to herein as "object plane array of individually programmable elements." In an example embodiment, object plane array of individually programmable elements PD are used in conjunction with pupil plane array of individually programmable elements 100. For example, the object plane array of individually programmable elements PD can be known-types of image-forming array of individually programmable elements and pupil plane array of individually programmable elements 100 can be pistoning mirror array of individually programmable elements. In this example embodiment, pupil plane array of individually programmable elements 100 can be used to compensate for aberrations and/or introduce desired aberrations (distortions) into an image formed by the object plane array of individually programmable elements PD.

Figure 6:
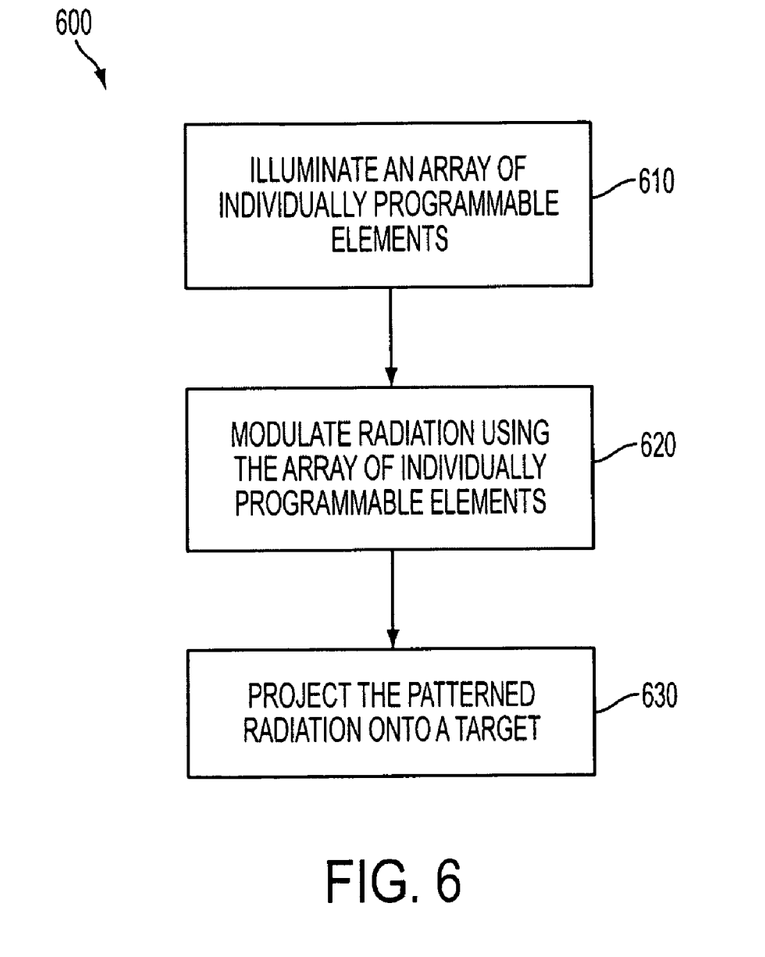
FIG. 6 is a flowchart illustrating an example method, in accordance with one embodiment of the present invention.

III. An Example Method of Using a Lithography System Having Pupil Plane Array of Individually Programmable Elements FIG. 6 is a flowchart 600 depicting an example method for using a lithography system, in accordance with one embodiment of the present invention. For example, the lithography system can be similar to the lithography system 1 of FIG. 1. The method of flowchart 600 begins at a step 610, in which an array of individually programmable elements located at a pupil plane of the lithography system or the projection system is illuminated with radiation. The array of individually programmable elements can be, for example, pupil plane array of individually programmable elements 100 described above with reference to example lithography system 1. The pupil plane can be, for example, a pupil plane of projection system PS. The array of individually programmable elements can be illuminated with radiation from illumination system IL of the lithographic apparatus (FIG. 1), or the array of individually programmable elements can be illuminated by an alternative illumination system, as described above or below.

In a step 620, the radiation is modulated by using the array of individually programmable elements located at the pupil plane. For example, the array of individually programmable elements can be array of individually programmable elements 100 (FIG. 1). The radiation can be patterned using techniques known to a person skilled in the relevant art(s), including, for example, using a field stop to modulate the patterned radiation. In addition, as described above, patterning the radiation can include modulating an amplitude and phase of the radiation by using the array of individually programmable elements.

In a step 630, the patterned radiation is projected onto a target portion of a substrate, which is located at an image plane. For example, projection system PS can include an optical system that projects the patterned radiation onto the target portion of the substrate. As is well-known in the relevant art(s), the field distribution in the pupil plane is the Fourier Transform of the field distribution in the image plane.

In one example, by orienting the array of individually programmable elements in the pupil plane, a numerical aperture of the projection system is typically required to be such that the pixels of the array of individually programmable elements are significantly under-resolved. That is, the zero order diffraction of each array of individually programmable elements pixel are typically required to significantly overfill the field at the substrate (e.g., the image plane). The under-resolution can be achieved by different means, as discussed below.

In one example, a variant of a traditional Kohler illumination (e.g., as used in microscope illumination) is used to illuminate the array of individually programmable elements in the pupil plane. That is, in this example, an extended source provides radiation. The radiation is passed through an aperture and used to illuminate the array of individually programmable elements in the pupil plane. An example advantage of using an extended source will become apparent by first considering a point source. If a point source of radiation is passed through an aperture and used to illuminate the pupil plane, only a relatively small number of the pupil array of individually programmable elements pixels will be illuminated, i.e., only a relatively small number of pixels of the pupil plane array of individually programmable elements can be utilized. In contrast, by sending radiation from an extended source through an aperture, each point of the extended source is smeared in the pupil plane, consequently illuminating many pixels simultaneously. This enables a relatively larger number of pixels of the pupil plane array of individually programmable elements to be utilized.

In another example, an incoherent extended source is placed in the object plane. In a particular case of a point source (fully coherent illumination), this results in a plane wave falling onto the pupil plane array of individually programmable elements, which modulates the plane wave in a desired way.

A finite size of an object plane array of individually programmable elements typically limits the resolution of a lithographic system. In contrast, according to one example, the finite size of the pupil plane array of individually programmable elements will not limit the resolution of a lithographic system. For example, the pixels of the pupil plane array of individually programmable elements can be of a larger dimension than standard pixels of the array of individually programmable elements used in the object plane. Consequently, if pupil plane pixels are made larger than object plane pixels, an image generated by the pupil plane pixels can be modulated over a larger area than an image generated by the object plane pixels.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g., a thin film transistor layer and/or a color filter layer.

Although specific reference can have been made above to the use of embodiments of the present invention in the context of optical lithography, it will be appreciated that the present invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the present invention have been described above, it will be appreciated that the present invention can be practiced otherwise than as described. For example, the present invention can take the form of a computer program containing one or more sequences of machine-readable instructions describing a method as disclosed above, or a data storage medium (e.g., semiconductor memory, magnetic or optical disk) having such a computer program stored therein.

IV. Example Advantages

A lithography system utilizing an array of individually programmable elements in a pupil plane has several example advantages. For instance, placing the array of individually programmable elements in the pupil simplifies the optical system. As mentioned above and as is well-known in the relevant art(s), the field distribution in the pupil plane is the Fourier Transform of the field distribution in the object plane; and the field distribution in the image plane is the Fourier Transform of the field distribution in the pupil plane. In other words, compared to the field distribution in the object plane, the field distribution in the pupil plane is more closely related to the field distribution in the image plane. Accordingly, locating the array of individually programmable elements in the pupil plane can simplify the optical system.

Compared to an array of individually programmable elements located at the object plane, another example advantage of positioning an array of individually programmable elements in the pupil plane is its decreased sensitivity to an individual dead or broken programmable element (e.g., mirror). With respect to an object plane array, there is a one-to-one corresponds between each portion of an object plane with each portion of an image plane. Consequently, a dead or broken element in an object plane array will correspond with a portion of the image plane not being patterned. For example, during manufacturing of a chip, a broken or dead element in an object plane array can lead to a conductive trace not appearing on the chip. In contrast, with respect to a pupil plane array, each portion of a pupil plane is spread over the entire image (by virtue of the fact that the field in the image plane is the Fourier Transform of the field in the pupil plane). Consequently, a dead or broken element in a pupil plane array may lead to decreased sensitivity over the entire image field due to background radiation. However, a dead or broken element in the pupil plane array will not lead to an entire portion of the image not being patterned.

V. Conclusion

While various embodiments of the present invention have been described above, it should be understood that they have been presented by way of example only, and not limitation. It will be apparent to persons skilled in the relevant art(s) that various changes in form and detail can be made therein without departing from the spirit and scope of the present invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithography system, comprising:
an illumination system that supplies radiation; and
a projection system having a patterning device located at a pupil plane of the projection system,
wherein the patterning device patterns the radiation to form an image of an object plane without using a patterning device at the object plane, and
wherein the projection system projects the patterned radiation onto a target portion of a substrate.

2. The lithography system of claim 1, further comprising:
a field stop located at an intermediate image plane, wherein the field stop blocks at least a portion of the patterned radiation.

3. The lithography system of claim 1, wherein the illumination system comprises:
an extended illumination source that provides the radiation; and
an aperture through which the radiation is passed, wherein the radiation passed through the aperture is incident on the pupil plane.

4. The lithography system of claim 1, wherein the patterning device comprises:
individually controllable elements, each individually controllable element comprising a liquid crystal display (LCD) cell disposed upon a pistoning mirror.

5. A device manufacturing method, comprising:
(a) patterning radiation with a patterning device positioned at a pupil plane to form an image of an object plane without using a patterning device at the object plane; and
(b) projecting the patterned radiation onto a target portion of a substrate.

6. The method of claim 5, wherein step (a) further comprises:
filtering out a portion of the patterned radiation with a field stop disposed in an intermediate image plane.

7. The method of claim 5, wherein step (a) further comprises:
passing radiation from an extended source through an aperture to illuminate the patterning device.

8. A lithography system, comprising:
an illumination system that supplies radiation; and
a projection system having a patterning device located at a pupil plane of the projection system,
wherein the patterning device patterns the radiation to form an image of an object plane without using a patterning device at the object plane,
wherein the projection system projects the patterned radiation onto a target portion of a substrate,
wherein the patterning device comprises,
individually controllable elements; and
a controller that (i) displaces a first subset of the individually controllable elements away from an axis of the patterning device thereby modulating a phase of the radiation, and (ii) displaces a second subset of the individually controllable elements with respect to a third subset of the individually controllable elements causing diffracted radiation from the second subset of the individually controllable elements to interfere with diffracted radiation from the third subset of individually controllable elements thereby modulating an amplitude of the radiation.

9. A device manufacturing method, comprising:
(a) patterning radiation with a patterning device positioned at a pupil plane to form an image of an object plane without using a patterning device at the object plane; and
(b) projecting the patterned radiation onto a target portion of a substrate,
wherein the patterning device comprises individually controllable elements, and the patterning comprises:
displacing a first subset of the individually controllable elements away from an axis of the patterning device thereby modulating a phase of the radiation; and
displacing a second subset of the individually controllable elements with respect to a third subset of the individually controllable elements causing diffracted radiation from the second subset of the individually controllable elements to interfere with diffracted radiation from the third subset of individually controllable elements thereby modulating an amplitude of the radiation.

* * * * *